United States Patent [19]

Tanaka

[11] Patent Number: 4,906,872
[45] Date of Patent: Mar. 6, 1990

[54] INTEGRATED CIRCUIT DEVICE

[75] Inventor: Shigeru Tanaka, Fujisawa, Japan

[73] Assignee: Kabushiki Kaisha Toshiba, Kawasaki, Japan

[21] Appl. No.: 329,716

[22] Filed: Mar. 28, 1989

[30] Foreign Application Priority Data

Mar. 29, 1988 [JP] Japan .................................. 63-73286

[51] Int. Cl.$^4$ ........................ H03K 3/26; H03K 19/02
[52] U.S. Cl. .................................... 307/480; 307/303; 307/303.1; 364/490; 364/491
[58] Field of Search ...................... 307/480, 303, 303.1; 364/488–491

[56] References Cited

U.S. PATENT DOCUMENTS

4,577,276 3/1986 Dunlop et al. ...................... 364/488

Primary Examiner—Stanley D. Miller
Assistant Examiner—Margaret Rose Wambach
Attorney, Agent, or Firm—Finnegan, Henderson, Farabow, Garrett and Dunner

[57] ABSTRACT

In an integrataed circuit device such as a logic LSI having a row structure, each row includes a group of logic elements and a clock driver. Each clock driver is connected to a clock signal input wiring, a primary power supply wiring, and a primary ground wiring. The output terminals of the clock drivers in the rows are short-circuited by a clock signal output short-circuiting wiring.

6 Claims, 6 Drawing Sheets

INTEGRATED CIRCUIT DEVICE

BACKGROUND OF THE INVENTION

1. Field of the Invention

The present invention relates to an integrated circuit device such as a logic LSI using a clock signal and, more particularly, to an improvement of an integrated circuit device having a row structure.

2. Description of the Related Art

Figure 1:
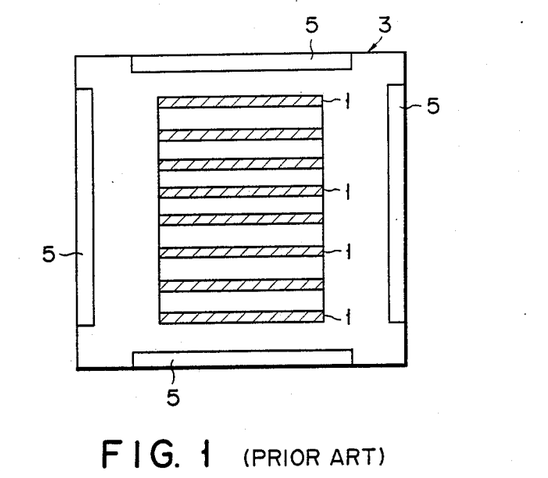
FIG. 1 is a block diagram showing a conventional logic LSI employing a row structure, in which a plurality of rows are arranged parallel to each other.

FIG. 1 is a block diagram of a conventional integrated circuit device such as a logic LSI, in which a plurality of rows are arranged parallel to each other, i.e., a so-called row structure logic LSI. More specifically, rows 1 in an LSI 3 respectively include a plurality of logic elements such as flip-flops, registers, and latches, and input/output blocks 5 are arranged at four sides of the LSI 3.

Figure 2:
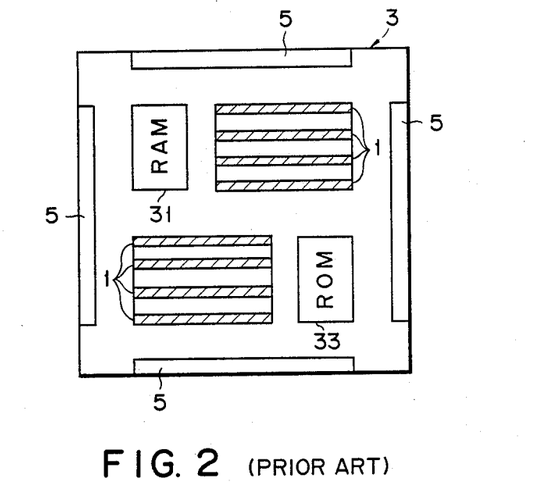
FIG. 2 is a block diagram showing a conventional logic LSI employing a macro block structure, in which a plurality of rows are arranged parallel to each other in one block, and a plurality of blocks including the rows are arranged in the LSI.

FIG. 2 is a block diagram of a conventional logic LSI employing a macro block structure. In FIG. 2, a plurality of rows are arranged in one block to be parallel to each other, and a plurality of blocks including these rows are arranged in an LSI 3 together with a RAM 31, a ROM 33, and so on. In this LSI, input/output blocks 5 are arranged at four sides.

Figure 3:
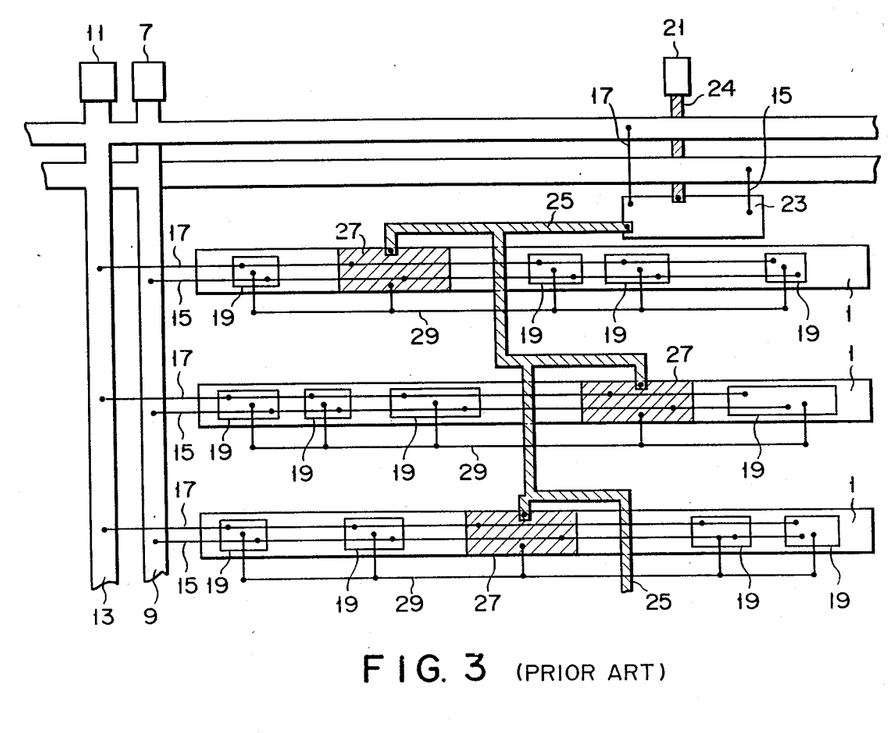
FIG. 3 is a block diagram showing the internal arrangement and the connection relationship of the plurality of rows in FIGS. 1 and 2.

The internal arrangement and the connection relationship of the plurality of rows are shown in detail in FIG. 3. Referring to FIG. 3, the rows 1 are arranged to be parallel to each other. Each row is connected to a primary power supply wiring 9 and a primary ground wiring 13 through a secondary power supply wiring 15 and a secondary ground wiring 17, respectively. The primary power supply wiring 9 is connected to a power supply through a power supply terminal 7 serving as a part of the input/output block 5. The primary ground wiring 13 is connected or grounded through a ground terminal 11 serving as a part of the input/output block 5 to hold a reference potential. A plurality of logic elements 19 in the plurality of rows 1 are driven by a clock signal. When a hierachical clock driving system is applied, the input terminal of a primary clock driver 23 is connected to a clock signal input terminal 21 serving as a part of the input/output block 5 through a clock signal input wiring 24. The output terminal of the primary clock driver 23 is connected to the input terminals of a plurality of secondary clock drivers 27 through a clock signal input wiring 25. Note that the driving ability of the plurality of secondary clock drivers 27 is generally smaller than that of the primary clock driver 23. The power supply and ground terminals of the primary clock driver 23 are connected to the primary power supply wiring 9 and the primary ground wiring 13 through the secondary power supply wiring 15 and the secondary ground wiring 17, respectively. In addition, the output terminals of the plurality of secondary clock drivers 27 are connected to the plurality of logic elements 19 through clock signal output wirings 29, respectively.

The wiring distances of the clock signal input wiring 25 from the output terminal of the primary clock driver 23 to the input terminals of the plurality of secondary clock drivers 27 are different from each other depending on the position of each secondary clock driver 27. Therefore, a skew of a clock signal may be generated due to the resistance and capacitance of the clock signal input wiring 25. When the skew is generated, the plurality of secondary clock drivers 27 cannot switch synchronously with each other, and hence an operation error may occur.

SUMMARY OF THE INVENTION

The present invention has been made in order to eliminate the above drawbacks, and has as its object to provide an integrated circuit device having a row structure which can reduce a skew of a clock signal.

In order to achieve the above object, an integrated circuit of the present invention, comprises: a primary power supply wiring connected to a power supply; a primary ground wiring connected to a ground terminal, for holding a reference potential; primary clock driver means for receiving a clock signal from a clock signal input terminal; a first clock signal input wiring (24) for connecting the clock signal input terminal to the primary clock driver means; a first row including a first secondary clock driver having a clock signal input terminal connected to the primary clock driver means through a second clock signal input wiring, a power supply terminal connected to the primary power supply wiring, and a ground terminal connected to a primary ground wiring, and a first group of a plurality logic elements, which switch synchronously with the input clock signal, each having a power supply terminal and a ground terminal respectively connected to the primary power supply wiring and the primary ground wiring; a first secondary power supply wiring for connecting the primary power supply wiring to the power supply terminal of the first secondary clock driver in the first row, and to the power supply terminals of the first group of logic elements; a first secondary ground wiring for connecting the primary ground wiring to the ground terminal of the first secondary clock driver in the first row, and to the ground terminals of the logic elements; a second row arranged parallel to a longitudinal direction of the first row, the second row including a second secondary clock driver having a clock signal input terminal connected to the primary clock driver means through the second clock signal input wiring, a power supply terminal connected to the primary power supply wiring, and a ground terminal connected to the primary ground wiring, and a second group of a plurality of logic elements, which switch synchronously with the input clock signal, each having a power supply terminal and a ground terminal respectively connected to the primary power supply wiring and the primary ground wiring; a second secondary power supply wiring for connecting the primary power supply wiring to the power supply terminal of the second secondary clock driver in the second row and to the power supply terminals of the second group of logic elements; a second secondary ground wiring for connecting the primary ground wiring to the ground terminal of the second secondary clock driver in the second row and to the ground terminals of the logic elements; the second clock signal input wiring for connecting the input terminals of the first and second secondary clock drivers to an output terminal of the first clock driver means; and a clock signal output short-circuiting wiring (35) connected to the clock signal output terminals of the first and second secondary clock drivers.

With the above arrangement, the integrated circuit device according to the present invention can reduce a skew of a clock signal, and can obtain a stable operation without an operation error. In addition, noise can be reduced, and high integration circuit can be achieved.

DETAILED DESCRIPTION OF THE PREFERRED EMBODIMENTS

Embodiments of an integrated circuit device according to the present invention will be described hereinafter with reference to FIGS. 4 to 7.

Figure 4:
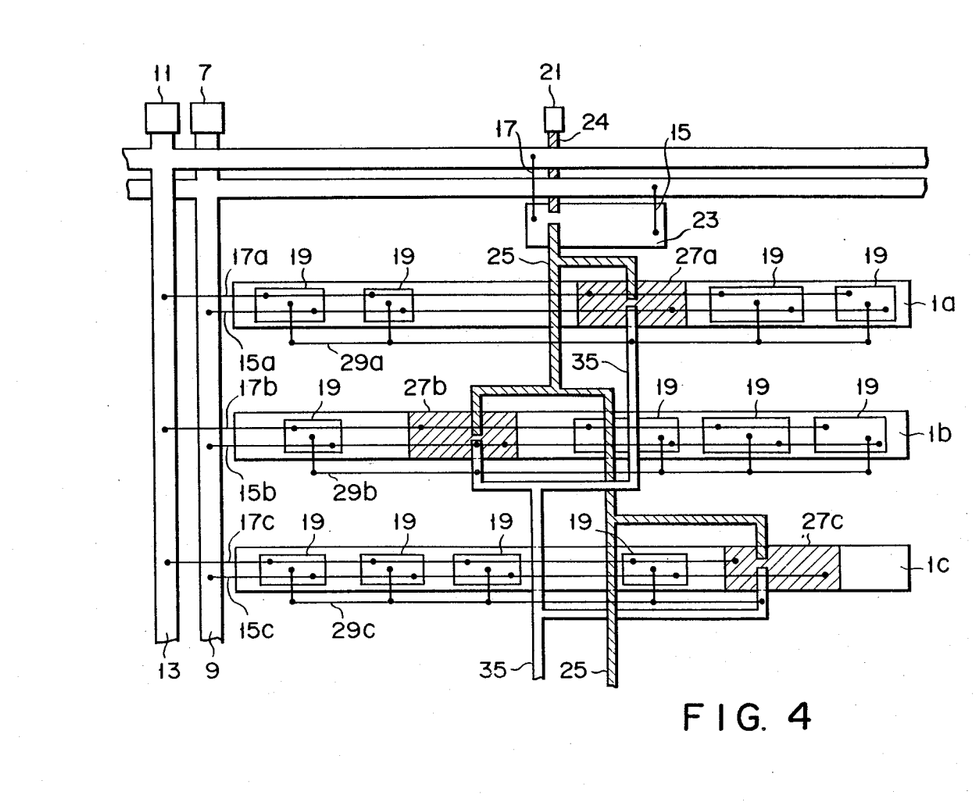
FIG. 4 is a block diagram showing an arrangement of an integrated circuit device according to an embodiment of the present invention.

An arrangement according to an embodiment of the present invention in FIG. 4 will be described below. A primary clock driver 23 is connected to a clock signal input terminal 21 serving as a part of one of input/output blocks 5 which are the same as those in FIGS. 1 and 2, through a primary clock signal wiring 24. The primary clock driver 23 has an inverter (not shown) and outputs an output signal in response to a clock input signal. A plurality of rows 1a, 1b, and 1c respectively include a plurality of logic elements 19 such as flip-flops, registers, and latches, and are arranged parallel in the longitudinal direction. The plurality of rows 1a, 1b, and 1c respectively include secondary clock drivers 27 each having a smaller driving capability than that of the primary clock driver 23 including the inverter. The input terminals of the secondary clock drivers 27 are connected to the output terminal of the primary clock driver 23 through the clock signal input wiring 25. The output terminals of the plurality of secondary clock drivers 27 are connected to the plurality of logic elements 19 in the plurality of rows 1a, 1b, and 1c through clock signal output wirings 29a, 29b, and 29c, respectively. The output terminals of the plurality of second clock drivers 27 are connected to each other through a clock signal output short-circuiting wiring 35. A primary power supply wiring 9 and a primary ground wiring 13 are arranged perpendicularly to the longitudinal direction of the plurality of rows 1a, 1b, and 1c. The primary power supply wiring 9 and the primary ground wiring 13 are respectively connected to a power supply terminal 7 and a ground terminal 11 serving as parts of the above-mentioned input/output blocks 5, power supply and ground terminals of the plurality of secondary clock drivers 27, power supply and ground terminals of the plurality of logic elements 19, through a secondary power supply wiring 15 and a secondary ground wiring 17.

Note that if either the primary power supply wiring 9 or the primary ground wiring 13 is arranged adjacent to the rows 1a, 1b, and 1c, the same effect can be obtained.

The effect of this embodiment will be described below.

In this embodiment, by arranging the clock signal short-circuiting wiring 35, the outputs from the plurality of secondary clock drivers 27 are short-circuited. Therefore, the loads of the plurality of secondary clock drivers 27 are uniformly applied, and hence a skew which is a time offset of the clock signal can be reduced. Recently, as the size and the operation speed of an LSI have been increased, a design and layout method of the clock signal having a small skew is required to assure a stable operation. Therefore, this embodiment is effective for a stable operation of the LSI.

Figure 5:
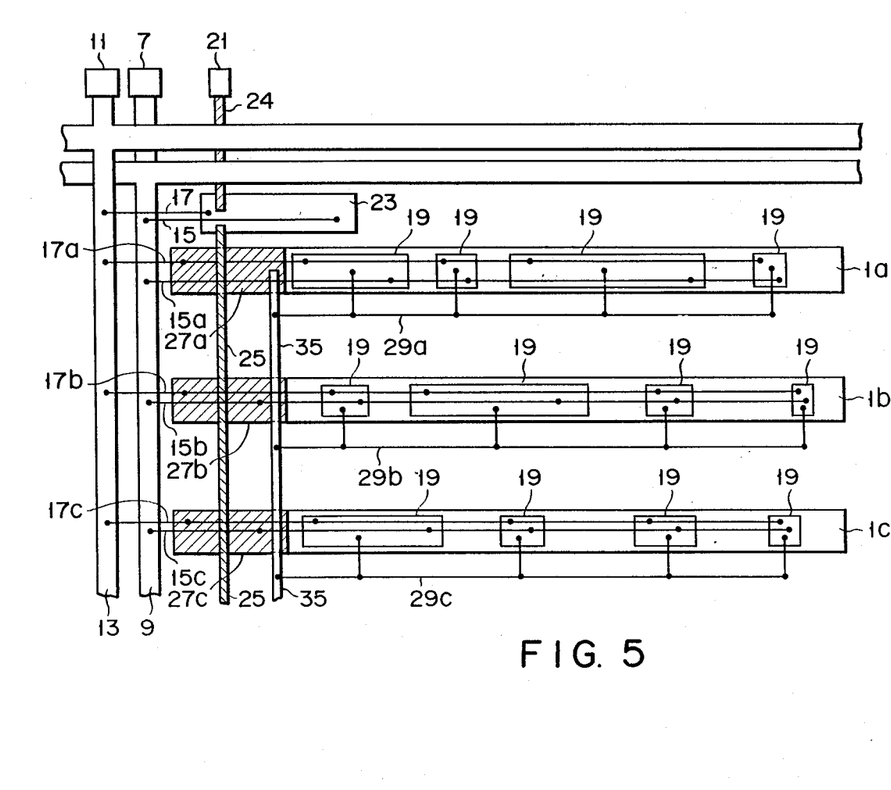
FIG. 5 is a block diagram showing an arrangement of the integrated circuit device according to another embodiment of the present invention.

An arrangement of a second embodiment will be described below with reference to FIG. 5. The difference between the first and second embodiments is as follows. In the second embodiment, each secondary clock driver 27 is arranged at an end of a corresponding row at a primary power supply wiring 9 side with respect to the longitudinal direction of rows 1a, 1b, and 1c, and a clock signal input wiring 25 and a clock signal output short-circuiting wiring 35 are arranged perpendicularly to the longitudinal direction of the rows 1a, 1b, and 1c. Other arrangements in the second embodiment are the same as those in the first embodiment.

The effect of the second embodiment will be described below. In the second embodiment, in addition to the effect of the first embodiment, the distances from the primary power supply wiring 9 and the primary ground wiring 13 to the plurality of secondary clock drivers 27a, 27b, and 27c are shortened, and the resistance, the capacitance, and the impedance of wiring are decreased. Therefore, clock signal switching noise which causes an operation error of the plurality of logic elements 19 can be suppressed. More specifically, in the leading and trailing edges of the clock signal, due to perform a switching operation of all the secondary clock drivers 27a, 27b, and 27c, although a large amount of current flows through the secondary power supply wirings 15a, 15b, and 15c, and the secondary ground wirings 17a, 17b, and 17c, the generated noise can be effectively reduced.

The clock signal input wiring 25 and the clock signal output short-circuiting wiring 35 are arranged perpendicularly to the longitudinal direction of the plurality of rows 1a, 1b, and 1c, so that the total area of the clock signal input wiring 25 and the total area of the clock signal output short-circuiting wiring 35 between the plurality of rows 1a, 1b, and 1c is decreased. Therefore, the integration of the LSI can be improved, and hence the resistances and capacitances of the clock signal input wiring 25 an the clock signal output short-circuiting wiring 35 are decreased. As a result, a skew which is an RC delay caused by the resistances and the capacitances can be further reduced as compared with the first embodiment.

Figure 6:
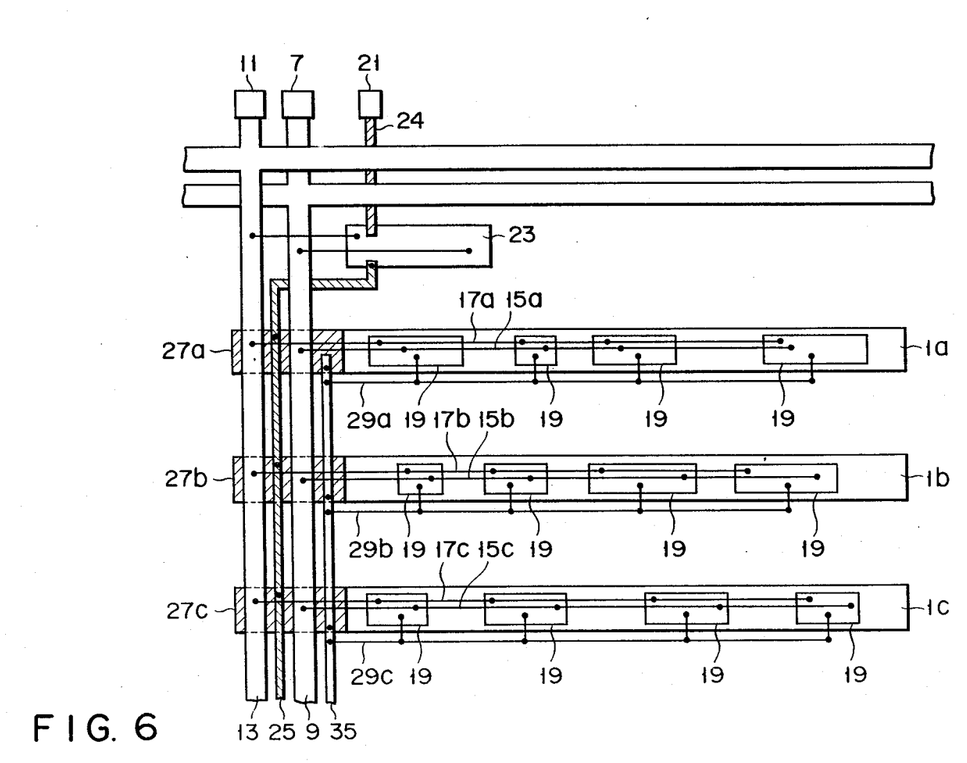
FIG. 6 is a block diagram showing an arrangement of the integrated circuit device according to still another embodiment of the present invention.

An arrangement of a third embodiment shown in FIG. 6 will be described below. In the third embodiment, a plurality of secondary clock drivers 27a, 27b, and 27c are respectively arranged at the ends of the rows adjacent to a primary power supply wiring 9 and a primary ground wiring 13 in the longitudinal direction of a plurality of rows 1a, 1b, and 1c. The primary power supply wiring 9 and the primary ground wiring 13 are positioned on the plurality of secondary clock drivers 27a, 27b, and 27c. In addition, a clock signal input wiring 25 is interposed between the primary power supply wiring 9 and the primary ground wiring 13, and sources of the inverters (not shown) of the secondary clock drivers 27 are connected to the primary power supply wiring 9 and the primary ground wiring 13. The third embodiment has the same arrangement as in the second embodiment except for the above points.

The effect of the third embodiment will be described below. In the third embodiment, the same effect as in the second embodiment can be obtained. In addition, the distances from the primary power supply wiring 9 and the primary ground wiring 13 to the plurality of secondary clock drivers 27a, 27b, and 27c are further decreased as compared with the second embodiment. Therefore, clock signal switching noise which causes an operation error of the plurality of logic elements 19 can be further suppressed as compared with the second embodiment. More specifically, in the leading and trailing edges of the clock signal, due to perform a switching operation of all the secondary clock drivers 27a, 27b, and 27c, although the large amount of current flows through the secondary power supply wiring 15 and the secondary ground wiring 17, the generated noise can be further reduced as compared with the second embodiment. In addition, the primary powersupply wiring 9 and the primary ground wiring 13 are positioned on the secondary clock drivers 27a, 27b, and 27c, so that the block area can be effectively decreased.

Figure 7:
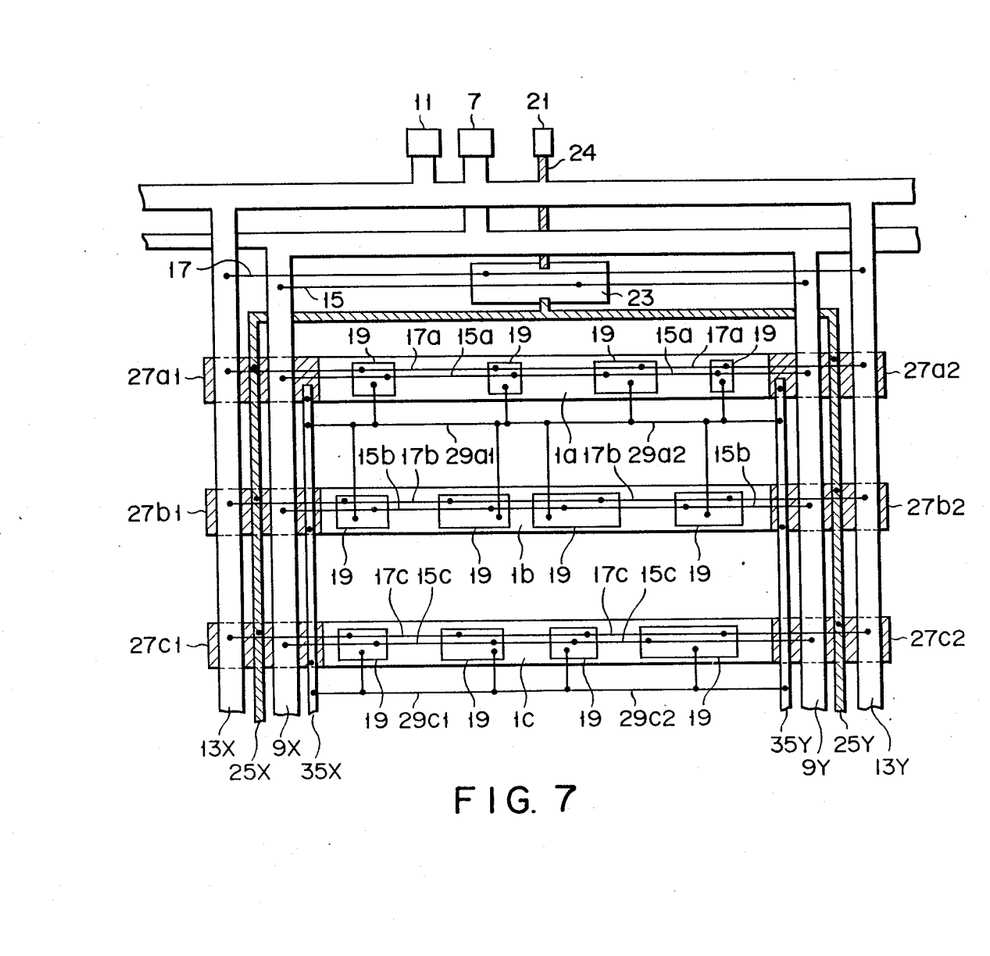
FIG. 7 is a block diagram showing an arrangement of the integrated circuit device according to still another embodiment of the present invention.

An arrangement of a fourth embodiment shown in FIG. 7 will be described below. In the fourth embodiment, pairs of secondary clock drivers 27a1 and 27a2, 27b1 and 27b2, and 27c1 and 27c2 are respectively arranged at both the ends of the plurality of rows 1a, 1b, and 1c in their longitudinal direction. In addition, in the same manner as in the third embodiment, primary power supply wirings 9X and 9Y, primary ground wirings 13X and 13Y, clock signal input wirings 25X and 25Y, and clock signal output short-circuiting wirings 35X and 35Y are linearly arranged on the pairs of secondary clock drivers 27a1 and 27a2, 27b1 and 27b2, and 27c1 and 27c2, so as to extend in a direction perpendicular to the longitudinal direction of the plurality of rows 1a, 1b, and 1c. Furthermore, a plurality of logic elements 19 in the rows are respectively connected to the primary power supply wirings 9X and 9Y, and the primary ground wirings 13X and 13Y through secondary power supply wirings 15a, 15b, and 15c, and secondary ground wirings 17a, 17b, and 17c. In this embodiment, the logic elements 19 in the rows 1a and 1b are connected through common clock signal output wirings 29a1 and 29a2.

The effect of the fourth embodiment will be described below. First, even if the number of the logic elements 19 in the row 1a is large, the skew is effectively decreased. In the fourth embodiment, in addition to the effect of the third embodiment, the number of the secondary clock drivers 27 respectively included in the plurality of rows 1a, 1b, and 1c can be set to be an optimal number to reduce a skew, depending on the number of gates in the plurality of rows 1a, 1b, and 1c, the amount of the load. More specifically, in the fourth embodiment, the pairs of secondary clock drivers 27a1 and 27a2, 27b1 and 27b2, and 27c1 and 27c2 are arranged in the rows 1a, 1b, and 1c, respectively. However, the number of secondary clock drivers respectively included in the plurality of rows 1a, 1b, and 1c is not limited to two in this embodiment, and the optimal number to reduce a skew can be selected.

Although the four embodiments has been described above, the present invention is not limited thereto. For example, the secondary clock drivers 27 need not be included in all the plurality of rows 1a, 1b, and 1c, and can be arranged every several rows.

The layout design of above-mentioned secondary clock drivers 27 can be performed either by automatic design or by manual design by a small number of steps.

In the above-mentioned four embodiments, the clock signal output terminals of the secondary clock drivers are short-circuited by the clock signal output short-circuiting wirings, so that skews which are time delays of the clock signals between the plurality of rows 1a, 1b, and 1c can be reduced, thus providing a clock signal wiring arrangement which assures a stable LSI operation.

As has been described above, according to the present invention, an LSI with reduced clock skew which assures a stable operation will be provided.

What is claimed is:

1. An integrated circuit device comprising:
   a primary power supply wiring connected to a power supply;
   a primary ground wiring connected to a ground terminal, for holding a reference potential;
   primary clock driver means for receiving a clock signal from a clock signal input terminal;
   a first clock signal input wiring for connecting said clock signal input terminal to said primary clock driver means;
   a first row including a first secondary clock driver having a clock signal input terminal connected to said primary clock driver means through a second clock signal input wiring, a power supply terminal connected to a primary power supply wiring, and a ground terminal connected to a primary ground wiring, and a first group of a plurality of logic elements, which switch synchronously with the input clock signal, each having a power supply terminal and a ground terminal respectively connected to said primary power supply wiring and said primary ground wiring;
   a first secondary power supply wiring for connecting said primary power supply wiring to said power supply terminal of said first secondary clock driver in said first row and to said power supply terminals of said first group of logic elements;
   a first secondary ground wiring for connecting said primary ground wiring to said ground terminal of said first secondary clock driver in said first row and to said ground terminals of said logic elements;
   a second row arranged parallel to a longitudinal direction of said first row, said second row including a second secondary clock driver having a clock signal input terminal connected to said primary clock driver means through said second clock signal input wiring, a power supply terminal connected to said primary power supply wiring, and a ground terminal connected to said primary ground wiring, and a second group of a plurality of logic elements, which switch synchronously with the input clock signal, each having a power supply terminal and a ground terminal respectively connected to said primary power supply wiring and said primary ground wiring;

a second secondary power supply wiring for connecting said primary power supply wiring to said power supply terminal of said second secondary clock driver in said second row and to said power supply terminals of said second group of logic elements;

a second secondary ground wiring for connecting said primary ground wiring to said ground terminal of said second secondary clock driver in said second row and to said ground terminals of said logic elements;

a second clock signal input wiring for connecting the input terminals of said first and second secondary clock drivers to an output terminal of said primary clock driver means; and a clock signal output short-circuiting wiring connected to the clock signal output terminals of said first and second secondary clock drivers.

2. A device according to claim 1, wherein said first secondary clock driver included in said first row, and said second secondary clock driver included in said second row are respectively arranged at one end of said first row and one end of said second row to be adjacent to said primary power supply wiring and said primary ground wiring.

3. A device according to claim 1, wherein said second clock signal input wiring and said clock signal output short-circuiting wiring are arranged on said first secondary clock driver included in said first row, and said second secondary clock driver included in said second row along a direction perpendicular to the longitudinal direction of said drivers.

4. An integrated circuit device comprising:

first and second primary power supply wirings commonly connected to a power supply, and divided to be arranged as two lines;

first and second primary ground wirings commonly connected to a ground terminal, and divided to be arranged as two lines, for holding a reference potential;

primary clock driver means for receiving a clock signal from a clock signal input terminal;

a first clock signal input wiring for connecting said clock signal input terminal to said primary clock driver means;

a first row including first and second secondary clock drivers, said drivers respectively having clock signal input terminals connected to said primary clock driver means through second clock signal input wirings, power supply terminals respectively connected to said first and second primary power supply wirings, and ground terminals respectively connected to said first and second primary ground wirings, and a first group of a plurality of logic elements, which switch synchronously with the input clock signal, each having a power supply terminal and a ground terminal respectively connected to said first and second primary power supply wirings and said first and second primary ground wirings;

a first secondary power supply wiring for respectively connecting said first and second primary power supply wirings to said power supply terminals of said first and second secondary clock drivers in said first row and to said power supply terminals of said first group of logic elements;

a first secondary ground wiring for respectively connecting said first and second primary ground wirings to said ground terminals of said first and second secondary clock drivers in said first row and to said ground terminals of said first group of logic elements;

a second row arranged parallel in the longitudinal direction of said first row, said second row including first and second secondary clock drivers, said drivers respectively having clock signal input terminals connected to said primary clock driver means through said second clock signal input wirings, power supply terminals connected to said first and second primary power supply wirings, and ground terminals connected to said first and second primary ground wirings, and a second group of a plurality of logic elements, which switch synchronously with the input clock signal, each having a power supply terminal and a ground terminal respectively connected to said first and second primary power supply wirings and said first and second primary ground wirings;

a second secondary power supply wiring for connecting said first and second primary power supply wirings to said power supply terminals of said first and second secondary clock drivers in said second row and to said power supply terminals of said second group of logic elements;

a second secondary ground wiring for connecting said first and second primary ground wirings to said ground terminals of said first and second secondary clock drivers in said second row and to said ground terminals of said second group of logic elements;

a second clock signal input wirings divided from an output terminal of said primary clock driver means, and respectively connected to said first secondary clock drivers and second secondary clock drivers, respectively, included in said first and second rows;

a first output short-circuiting wiring for connecting said first secondary clock drivers in said first row and said second row and a second output short-circuiting wiring for connecting said second secondary clock drivers to each other; and a clock signal wiring for commonly connecting said first clock signal output short-circuiting wiring to said first and second groups of logic elements corresponding to said first and second rows and included therein, and a second clock signal wiring for commonly connecting said second clock signal output short-circuiting wiring to said first and second groups of logic elements corresponding to said first and second rows and included therein;

a first clock signal wiring for connecting said clock signal output short-circuiting wiring to said first group of logic elements; and a second clock signal wiring for connecting said clock signal output short-circuiting wiring to said second group of logic elements.

5. A device according to claim 4, wherein said first and second secondary clock drivers included in said first row, and said first and second secondary clock drivers included in said second row are respectively arranged at ends of said first and second rows to be adjacent to said first and second primary power supply wirings and said first and second primary ground wirings.

6. A device according to claim 4, wherein said clock signal input wirings and said clock signal output short-circuiting wirings are respectively arranged on said first and second secondary clock drivers respectively included in said first and second rows along a direction perpendicular to the longitudinal direction of said rows.

* * * * *